(12) United States Patent
Tu et al.

(10) Patent No.: US 8,601,740 B2
(45) Date of Patent: Dec. 10, 2013

(54) AIRFLOW WINDOW

(75) Inventors: Chen-Ruei Tu, New Taipei (TW); Li-Ping Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/543,014

(22) Filed: Jul. 6, 2012

(65) Prior Publication Data

US 2013/0160366 A1    Jun. 27, 2013

(30) Foreign Application Priority Data

Dec. 22, 2011    (TW) .............................. 100148147 A

(51) Int. Cl.
*E06B 7/08*    (2006.01)

(52) U.S. Cl.
USPC ............................................ 49/92.1; 49/87.1

(58) Field of Classification Search
USPC ........ 49/73.1, 74.1, 77.1, 80.1; 454/164, 184; 361/679.45
See application file for complete search history.

(56) References Cited

U.S. PATENT DOCUMENTS

| | | | | |
|---|---|---|---|---|
| 2,739,521 A * | 3/1956 | Spear | ............................ | 454/349 |
| 3,292,309 A * | 12/1966 | Horner | ............................... | 49/64 |
| 3,913,270 A * | 10/1975 | Kumagai | ........................ | 49/360 |
| 3,991,518 A * | 11/1976 | Ishihara | ......................... | 49/74.1 |
| 4,033,073 A * | 7/1977 | Bogan | ............................... | 49/38 |
| 4,703,586 A * | 11/1987 | Smith et al. | ...................... | 49/307 |
| 4,887,391 A * | 12/1989 | Briggs, Sr. | ....................... | 49/90.1 |
| 4,967,490 A * | 11/1990 | Berger et al. | .................... | 34/235 |
| 5,167,574 A * | 12/1992 | Ikeda et al. | .................... | 454/164 |
| 5,277,658 A * | 1/1994 | Goettl | ........................... | 454/259 |
| 5,357,712 A * | 10/1994 | Streeter | .......................... | 49/92.1 |
| 5,718,274 A * | 2/1998 | Streeter | ................... | 160/176.1 P |
| 6,005,770 A * | 12/1999 | Schmitt | .......................... | 361/695 |
| 6,181,557 B1 * | 1/2001 | Gatti | .............................. | 361/695 |
| 6,588,811 B1 * | 7/2003 | Ferguson | ................... | 292/251.5 |
| 6,848,213 B1 * | 2/2005 | Swapp | ............................ | 49/82.1 |
| 7,567,159 B2 * | 7/2009 | Macken | ......................... | 335/306 |
| 7,637,543 B2 * | 12/2009 | Ferguson | ................... | 292/251.5 |
| 7,656,664 B2 * | 2/2010 | Ye et al. | ......................... | 361/695 |
| 7,669,633 B2 * | 3/2010 | Berger | ........................... | 160/107 |
| 7,800,902 B2 * | 9/2010 | Della Fiora et al. | .......... | 361/695 |
| 7,826,227 B2 * | 11/2010 | Wang et al. | ..................... | 361/703 |
| 7,942,458 B2 * | 5/2011 | Patterson | ................... | 292/251.5 |
| 8,002,111 B2 * | 8/2011 | Kollman et al. | .............. | 206/321 |
| 8,007,228 B2 * | 8/2011 | Wang | ............................. | 415/146 |
| 8,120,910 B2 * | 2/2012 | Hong | ............................ | 361/695 |
| 8,248,794 B2 * | 8/2012 | Li et al. | ......................... | 361/695 |
| 8,312,676 B2 * | 11/2012 | Maciulewicz | ................. | 49/74.1 |
| 8,365,468 B2 * | 2/2013 | Weekes | .......................... | 49/92.1 |
| 8,540,292 B2 * | 9/2013 | Ferguson | ................... | 292/251.5 |
| 2007/0097604 A1 * | 5/2007 | Bruski et al. | .................. | 361/605 |
| 2007/0137243 A1 * | 6/2007 | Lee et al. | ........................ | 62/419 |
| 2008/0295283 A1 * | 12/2008 | Tice | ................................ | 16/84 |
| 2010/0263282 A1 * | 10/2010 | Maciulewicz | ................. | 49/82.1 |
| 2010/0301720 A1 * | 12/2010 | Anderson et al. | .......... | 312/319.2 |
| 2010/0311317 A1 * | 12/2010 | McReynolds et al. | ........ | 454/256 |
| 2012/0003912 A1 * | 1/2012 | Hoover et al. | ................ | 454/184 |
| 2013/0056306 A1 * | 3/2013 | Lee et al. | ...................... | 187/314 |
| 2013/0065501 A1 * | 3/2013 | Wang | ............................ | 454/184 |

* cited by examiner

*Primary Examiner* — Katherine Mitchell
*Assistant Examiner* — Shiref Mekhaeil
(74) *Attorney, Agent, or Firm* — Altis Law Group, Inc.

(57) ABSTRACT

An airflow window includes an outer frame, an inner frame located in the outer frame, a plurality of shutters, and a magnet. The plurality of shutters is pivotably mounted on the inner frame. Each shutter includes metal. The magnet includes at least one magnet strip. The at least one magnet strip attracts the plurality of shutters at an open state. In the open state, the plurality of shutters is slanted relative to the outer frame.

12 Claims, 6 Drawing Sheets

AIRFLOW WINDOW

BACKGROUND

1. Technical Field

The disclosure generally relates to airflow windows, especially to an airflow window of a computer system.

2. Description of Related Art

Computer systems may include fans for dissipating heat from a plurality of electronic elements. An airflow window may be needed to prevent output airflow from flowing back to the computer system affecting the dissipation of the electronic elements.

Airflow window may include many shutters. The shutters may make noise when the shutters are repeatedly opened and closed. Thus, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
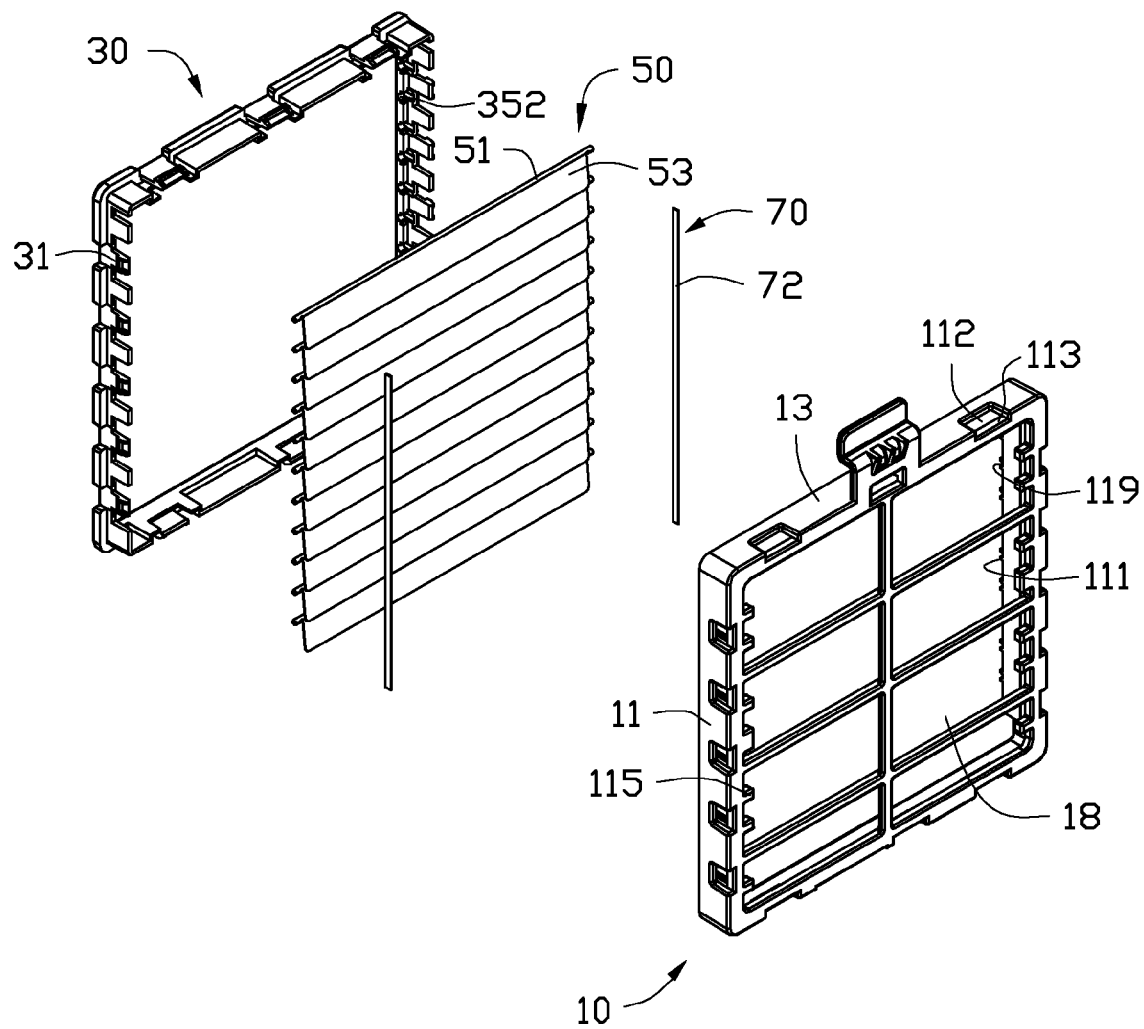
FIG. 1 is an exploded, isometric view of an airflow window in one embodiment.

Referring to FIG. 1, in one embodiment, an airflow window includes an outer frame 10, an inner frame 30, a magnet 70, and a plurality of shutters 50.

The outer frame 10 is substantially rectangular. The outer frame 10 includes two sidewalls 11, a top wall 13, and a bottom wall 15. The two sidewalls 11 are substantially parallel. A locking hole 112 is defined in each sidewall 11, the top wall 13 and the bottom wall 15. A restricting portion 113 is located aside each locking hole 112. An opening 18 is defined by the two sidewalls 11, the top wall 13 and the bottom wall 15. Each of the two sidewalls 11 includes an outer flange 111. A plurality of blocks 115 is located on the two sidewalls 11. A plurality of first mounting portions 119 is located on the outer flange 111.

The inner frame 30 is substantially rectangular. The inner frame 30 includes a plurality of resilient hooks 31. The inner frame 30 includes a plurality of second mounting portions 352.

Each shutter 50 includes a pivot portion 51 and a blade portion 53. The pivot portion 51 is rolled from an end of each blade portion 53. A length of the pivot portion 51 is greater than a length of the blade portion 53. The blade portion 53 may include metal, such as iron.

In one embodiment, the magnet 70 includes two magnet strips 72. The two magnet strips 72 may be permanent magnets or electromagnets.

Figure 2:
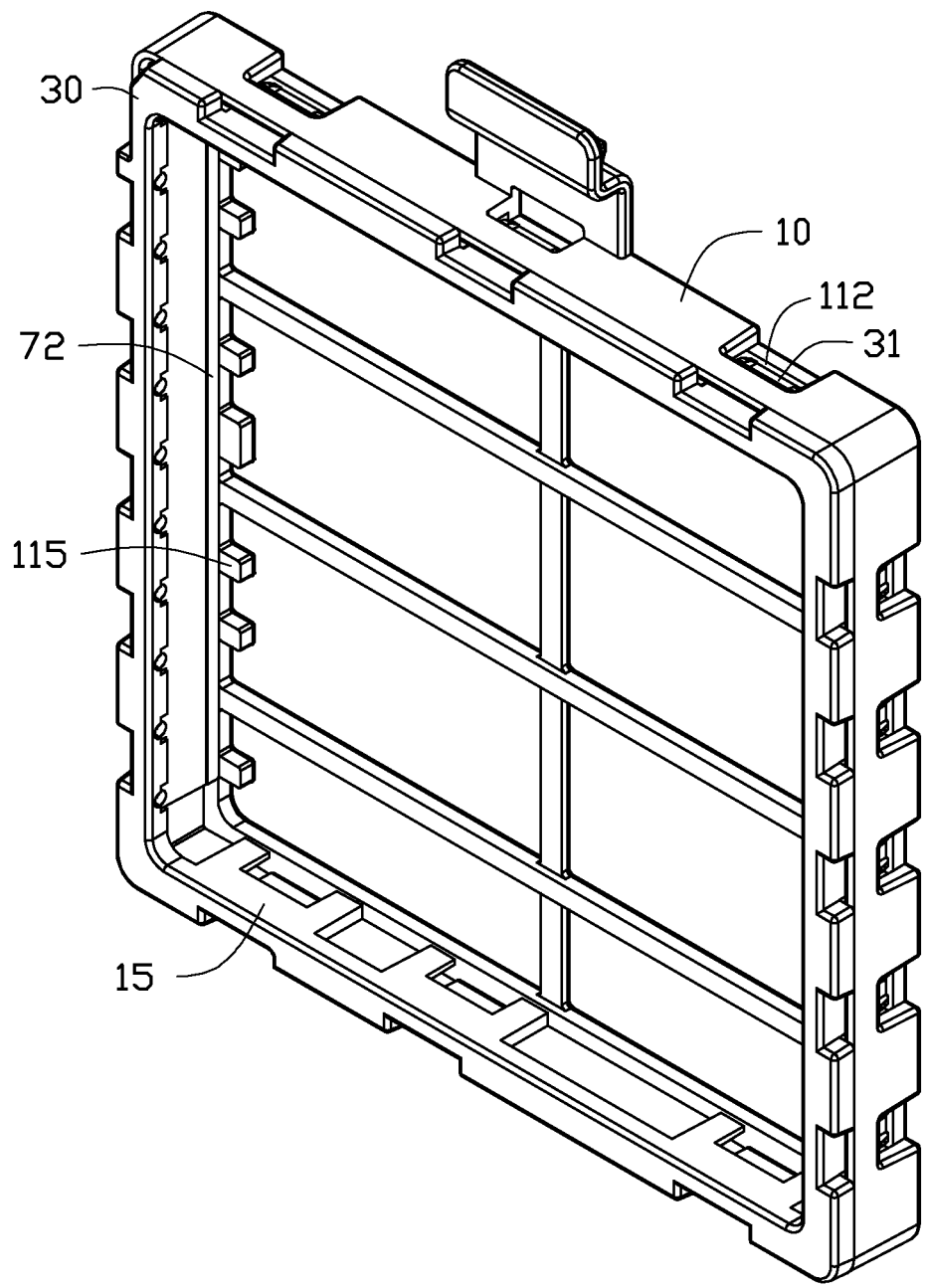
FIG. 2 is a partial assembled view of the airflow window of FIG. 1.
Figure 3:
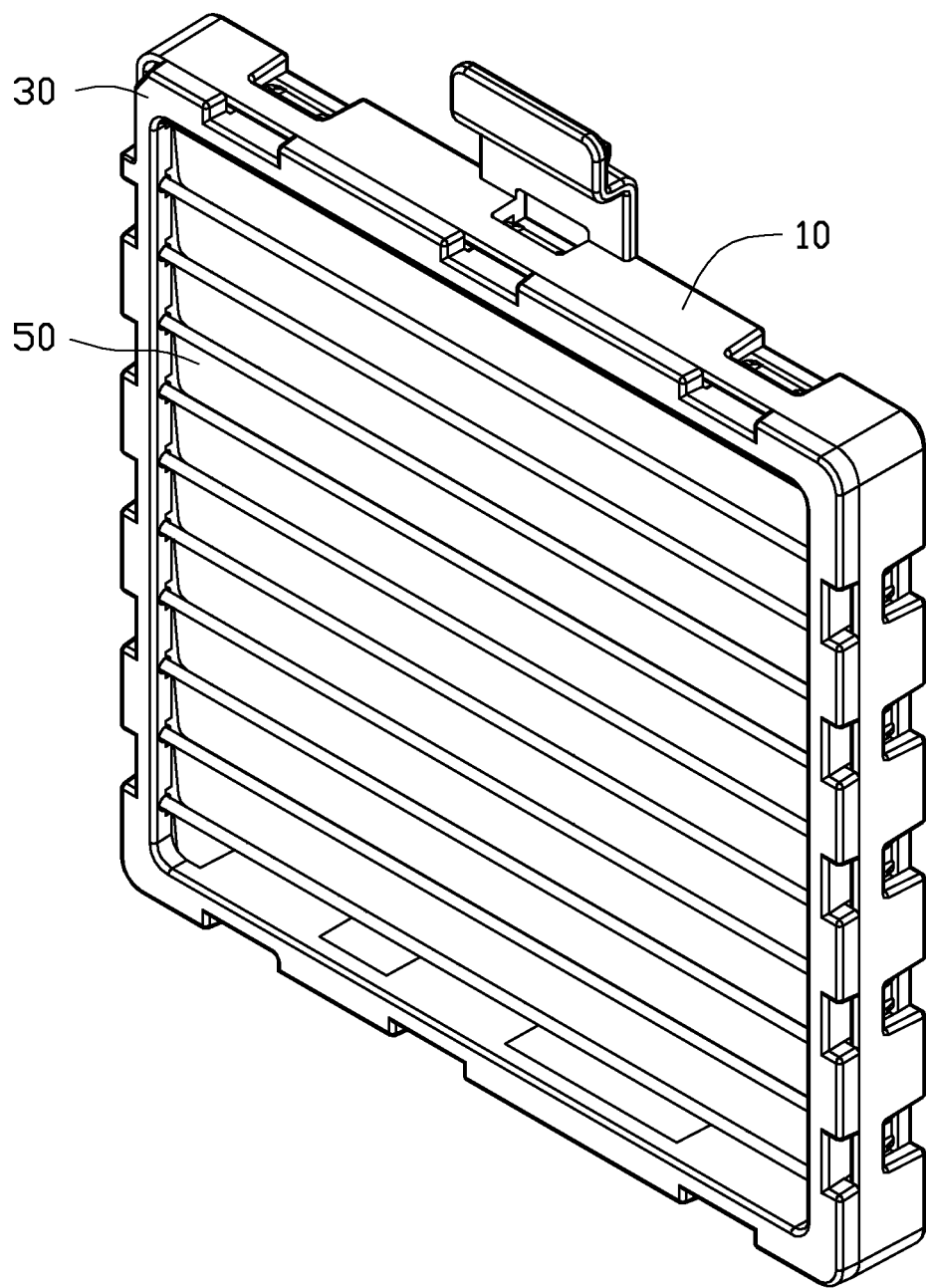
FIG. 3 is an assembled view of the airflow window of FIG. 1, but showing in another aspect.
Figure 4:
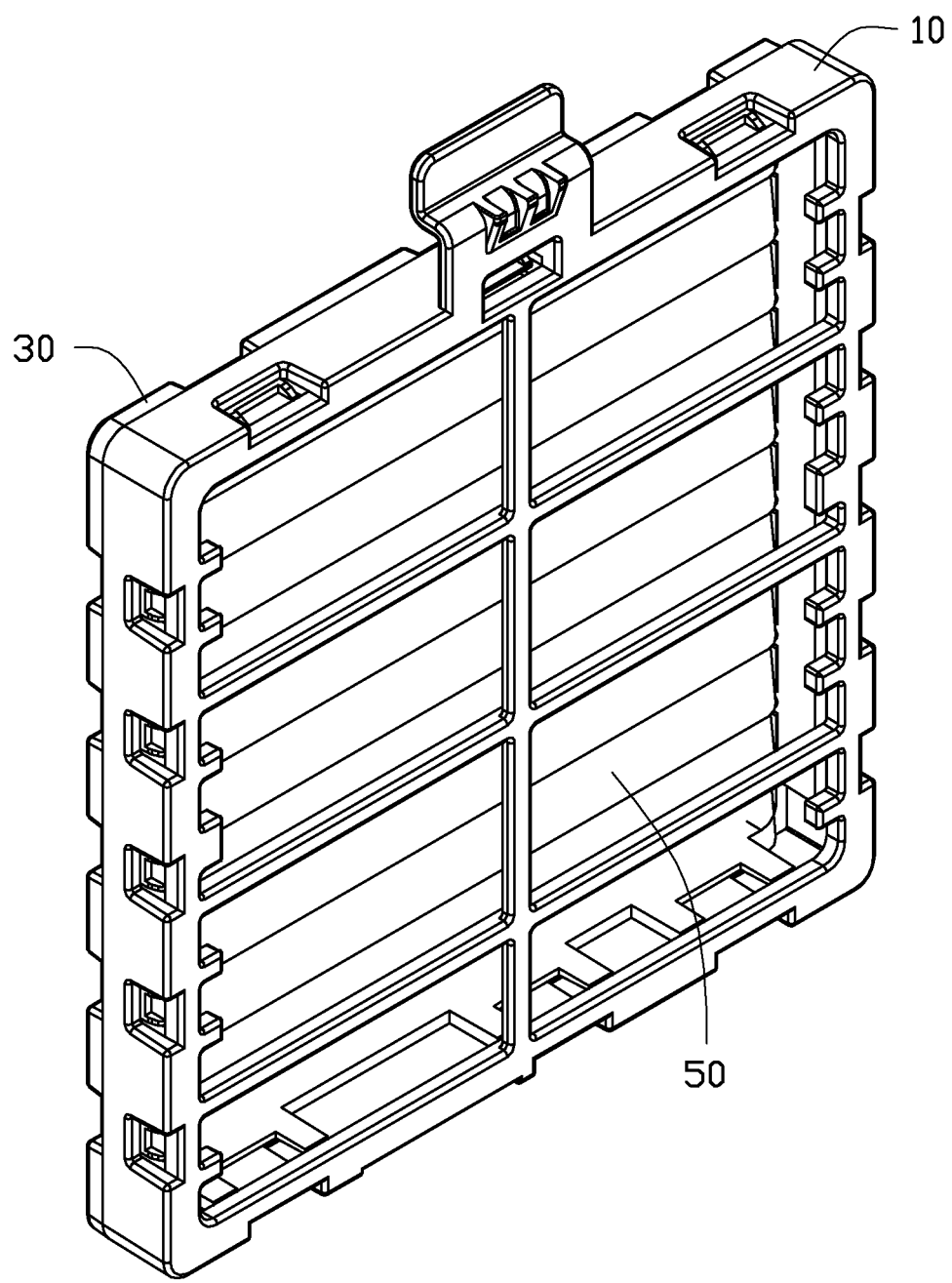
FIG. 4 is an assembled view of the airflow window of FIG. 1.

Referring through FIG. 2 to FIG. 4, in assembly, the magnet strips 72 are attached to an inner surface of each of the two sidewalls 11. The magnet strips 72 abut to the plurality of blocks 115. Each pivot portions 51 is located in one of the second mounting portions 352. The inner frame 30 is attached to an inner surface of the outer frame 10. The plurality of resilient hooks 31 are engaged with the corresponding locking holes 112 of the outer frame 10. The plurality of first mounting portions 119 are coupled to the plurality of second mounting portions 352. The pivot portions 51 are engaged between the plurality of first mounting portions 119 and the plurality of second mounting portions 352. Each of the plurality of pivot portions 51 extends along a first direction that is substantially perpendicular to the two parallel sidewalls 11. The magnet strips 72 extend along a second direction that is substantially perpendicular to the first direction. The magnet strips 72 may be located spaced from the pivot portion 51 of the shutter 50.

Figure 5:
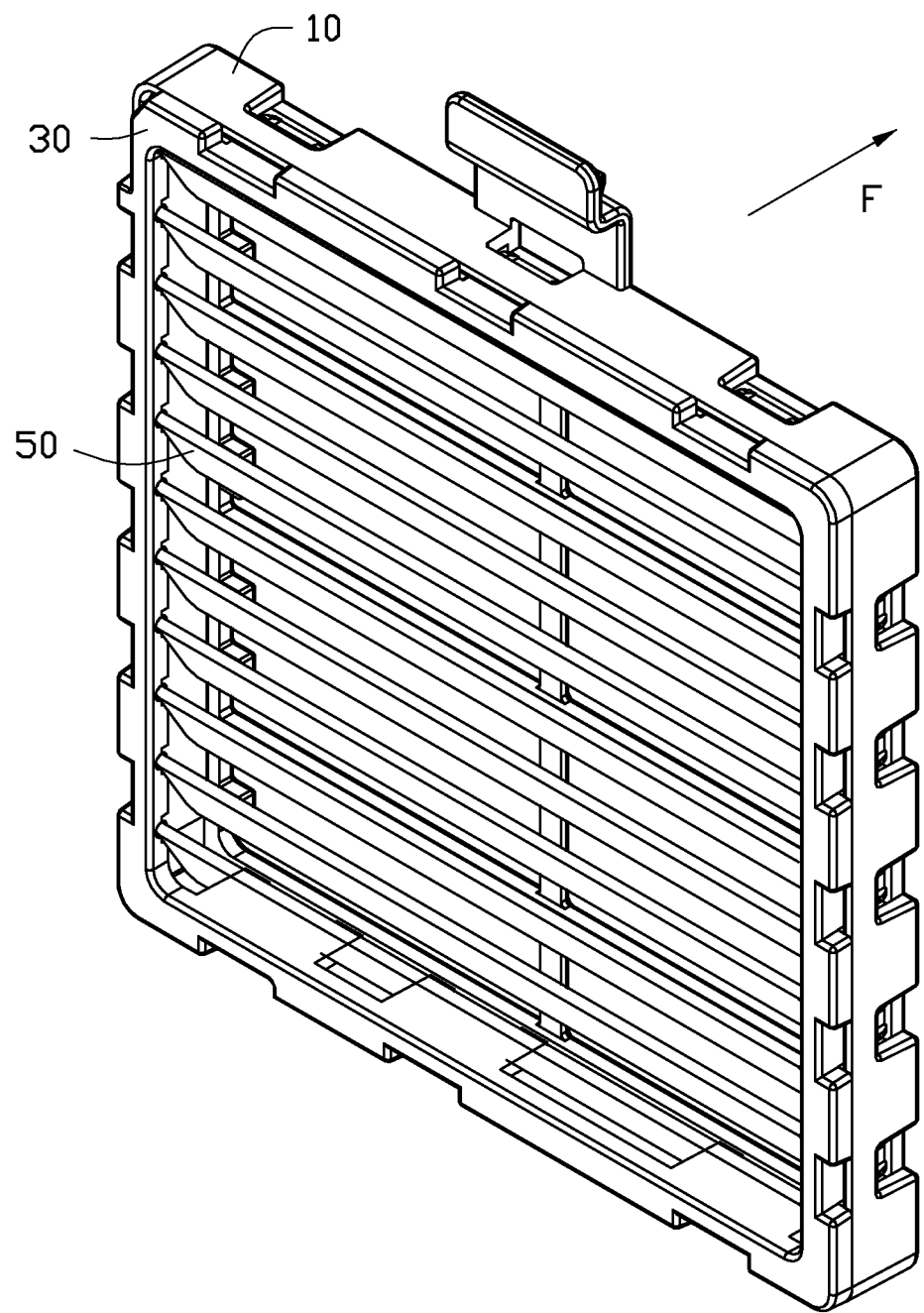
FIG. 5 is similar to FIG. 3, but showing a plurality of shutters in a first state.
Figure 6:
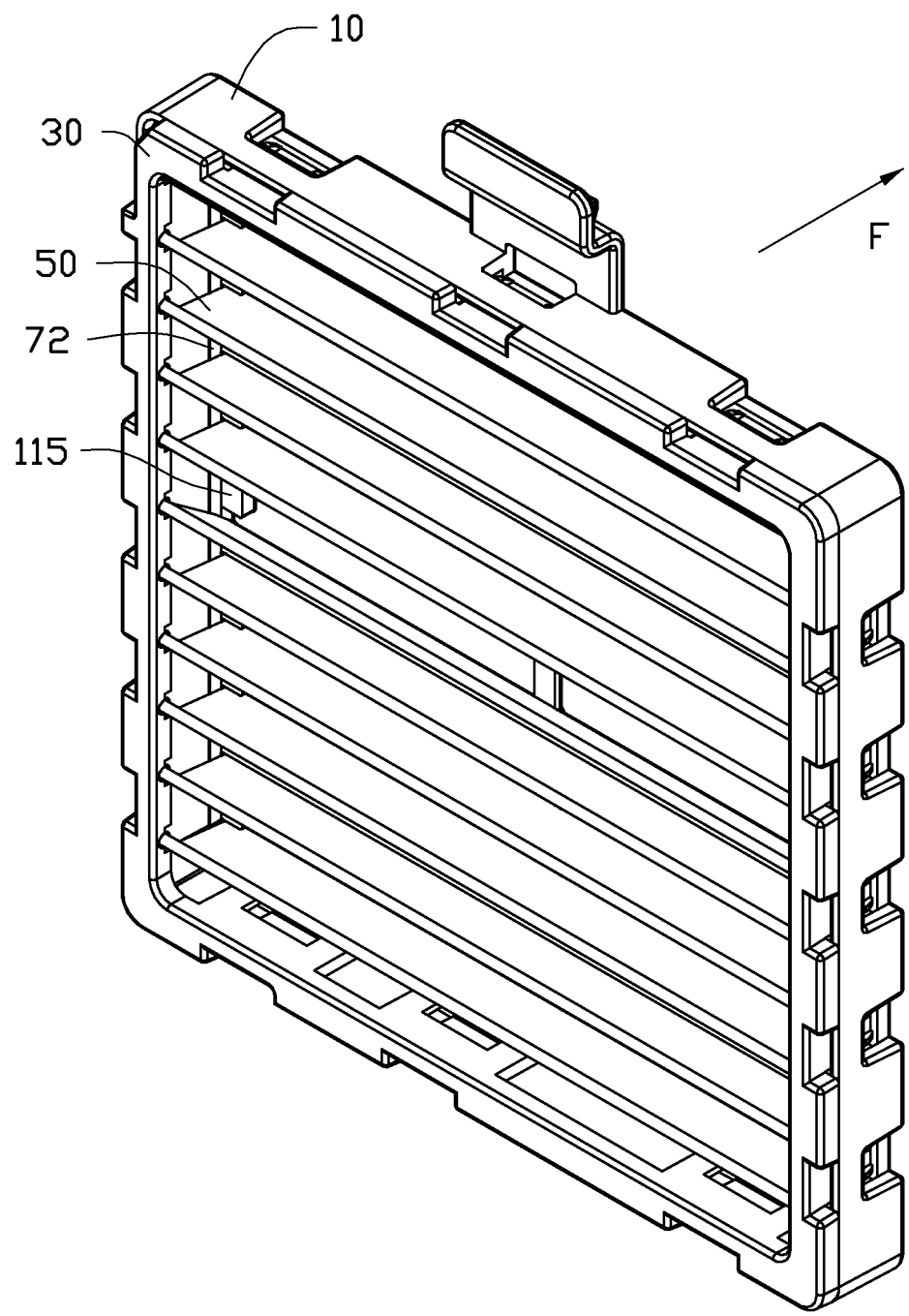
FIG. 6 is similar to FIG. 5, but showing the plurality of shutters in a second state.

Referring to FIG. 5 and FIG. 6, in use, the airflow window can be opened along one way direction by airflow F. In a closed state, the plurality of shutters 50 fall down naturally and shut the opening 18 of the outer frame 10. When the airflow F extends towards the plurality of shutters 50, the plurality of shutters 50 are blown upward and rotated to an open state. A distal end of each of the blade portions 53 of the plurality of the shutters 50 is rotated close to the magnet strips 72 at a partially open state as shown in FIG. 5. In the partially open state, the plurality of shutters 50 may be slanted relative to the outer frame 10, and the plurality of shutters 50 may flap up and down or rotate at a maximum angle as shown in FIG. 6, blocked by the plurality of blocks 115. The magnet strips 72 can attract the plurality of shutters 50 at a maximum force when the plurality of shutters 50 rotates to a desired angle in the partially open state. In this way, the magnet strips 72 on a substantially lateral side of the plurality of shutters 50 can reduce a rotating speed of the plurality of shutters 50 when the plurality of shutters 50 rotates to the closed state or to a maximum angle from the desired angle. A crash speed of the plurality of shutters 50 to the plurality of blocks 115 and to the inner frame 30 is also reduced. Thus, noise generated by the plurality of shutters 50 is reduced.

It is also understood, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An airflow window comprising:
    an outer frame defining a first opening, the outer frame comprising two sidewalls;
    an inner frame defining a second opening, the inner frame located in the outer frame, and the first opening communicating with the second opening;
    a plurality of shutters, each of the plurality of shutters, being pivotably mounted on the inner frame, each of the plurality of shutters comprising metal, each of the plurality of shutters located in a shutter plane, said plane is substantially perpendicular to each of the sidewalls, and the plurality of shutters being adapted to cooperatively block the first opening and the second opening when said shutters are in a closed state; and a magnet comprising a magnetic strip, and the magnetic strip is located on one of the sidewalls of the outer frame to attract the plurality of shutters on a substantially lateral side of the plurality of shutters to reduce a rotating speed of the plurality of shutters when the plurality of shutters rotates from an open state to the closed state.

2. The airflow window of claim 1, wherein each of the plurality of shutters comprises a pivot portion, and each of the plurality of pivot portions extends along a first direction that is substantially perpendicular to the two sidewalls.

3. The airflow window of claim 2, wherein the magnetic strip is located in a magnetic plane, that is substantially perpendicular to the first direction.

4. The airflow window of claim 1, wherein the inner frame comprises a plurality of resilient hooks, and the outer frame comprises a plurality of locking holes corresponding to the plurality of resilient hooks.

5. The airflow window of claim 1, wherein a plurality of blocks is located on the outer frame for preventing any excessive opening of the plurality of shutters, and the magnetic strip abuts the plurality of blocks.

6. The airflow window of claim 1, wherein the plurality of shutters comprises iron, and the magnetic strip is a permanent magnet.

7. An airflow window comprising:
an outer frame;
an inner frame located in the outer frame;
a plurality of shutters being pivotably mounted on the inner frame, each of the plurality of shutters comprising metal; and
a magnet comprising at least one magnetic strip, and the at least one magnetic strip adapted to attract the plurality of shutters towards a partially open state, where the plurality of shutters is slanted relative to the outer frame.

8. The airflow window of claim 7, wherein the outer frame comprises two substantially parallel sidewalls, the at least one magnetic strip is attached to the at least one of the two substantially parallel sidewalls; the each of the plurality of shutters comprises a pivot portion, and each pivot portion extends along a first direction that is substantially perpendicular to the two substantially parallel sidewalls.

9. The airflow window of claim 8, wherein the at least one magnetic strip is located in a magnetic plane, that is substantially perpendicular to the first direction.

10. The airflow window of claim 7, wherein the inner frame comprises a plurality of resilient hooks, and the outer frame comprises a plurality of locking holes corresponding to the plurality of resilient hooks.

11. The airflow window of claim 7, wherein a plurality of blocks is located on the outer frame for preventing excessive open of the plurality of shutters, and the at least one magnetic strip abuts the plurality of blocks.

12. The airflow window of claim 7, wherein the plurality of shutters comprises iron, and the at least one magnetic strips is a permanent magnet.

\* \* \* \* \*